(12) United States Patent
Jacob et al.

(10) Patent No.: US 10,355,043 B2
(45) Date of Patent: Jul. 16, 2019

(54) INTEGRATED VERTICAL TRANSISTORS AND LIGHT EMITTING DIODES

(71) Applicant: GLOBALFOUNDRIES INC., Grand Cayman (KY)

(72) Inventors: Ajey P. Jacob, Watervliet, NY (US); Deepak K. Nayak, Union City, CA (US); Srinivasa R. Banna, San Jose, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 54 days.

(21) Appl. No.: 15/635,608

(22) Filed: Jun. 28, 2017

(65) Prior Publication Data

US 2019/0006413 A1    Jan. 3, 2019

(51) Int. Cl.
*H01L 29/78* (2006.01)
*H01L 29/08* (2006.01)
*H01L 29/16* (2006.01)
*H01L 33/32* (2010.01)
*H01L 29/417* (2006.01)
*H01L 33/36* (2010.01)
*H01L 29/778* (2006.01)
*H01L 33/00* (2010.01)
*H01L 27/15* (2006.01)
*H01L 29/66* (2006.01)
*H01L 29/20* (2006.01)
(Continued)

(52) U.S. Cl.
CPC .......... *H01L 27/15* (2013.01); *H01L 29/0847* (2013.01); *H01L 29/1037* (2013.01); *H01L 29/16* (2013.01); *H01L 29/2003* (2013.01); *H01L 29/41741* (2013.01); *H01L 29/66522* (2013.01); *H01L 29/66666* (2013.01); *H01L 29/778* (2013.01); *H01L 29/7827* (2013.01); *H01L 33/007* (2013.01); *H01L 33/32* (2013.01); *H01L 33/36* (2013.01); *H01L 29/872* (2013.01); *H01L 2933/0016* (2013.01)

(58) Field of Classification Search
CPC . H01L 27/15; H01L 29/778; H01L 29/66522; H01L 29/2003; H01L 29/66666; H01L 33/007; H01L 29/1037; H01L 33/36; H01L 29/41741; H01L 29/16; H01L 33/32; H01L 29/7827; H01L 29/0847; H01L 2933/001
USPC .......................................................... 257/76
See application file for complete search history.

(56) References Cited

U.S. PATENT DOCUMENTS 6,207,977 B1 * 3/2001 Augusto ......... H01L 21/823885
257/19

OTHER PUBLICATIONS

Liu et al., "Metal-interconnection-free integration of InGaN/GaN light emitting diodes with AlGaN/GaN high electron mobility transistors", Applied Physics Letters 106, 181110, May 8, 2015, 5 pages.

(Continued)

*Primary Examiner* — Caleen O Sullivan
(74) *Attorney, Agent, or Firm* — Anthony Canale; Andrew M. Calderon; Roberts Mlotkowski Safran Cole & Calderon

(57) ABSTRACT

The present disclosure relates to semiconductor structures and, more particularly, to integrated vertical transistors and light emitting diodes and methods of manufacture. The structure includes a vertically oriented stack of material having a light emitting diode (LED) integrated with a source region and a drain region of a vertically oriented active device.

20 Claims, 5 Drawing Sheets

(51) Int. Cl.
*H01L 29/10* (2006.01)
*H01L 29/872* (2006.01)

(56) References Cited

OTHER PUBLICATIONS

Li et al., "Monolithic integration of light-emitting diodes and power metal-oxide-semiconductor channel high-electron-mobility transistors for light-emitting power integrated circuits in GaN on sapphire substrate", Applied Physics Letters 102, 192107, May 16, 2013, 3 pages.

Lee et al., "Monolithic integration of GaN-based lightemitting diodes and metal-oxide-semiconductor field-effect transistors", Optics Express, Oct. 1, 2014, 7 pages.

Park et al., "InGaN/GaN nanowires grown on SiO2 and light emitting diodes with low turn on voltages", Optics Express, May 15, 2015, 7 pages.

Cook, "Monolithic integration of nitride HEMTs and LEDs", Semiconductor Today Compounds & Advanced Silicon, vol. 9, Issue 5, Jun.-Jul. 2014, 2 pages.

Furukawa et al., "Monolithic integration of light-emitting devices and silicon transistors", SPIE 10.1117/2.1200711.0914, 2007, 2 pages.

* cited by examiner

US 10,355,043 B2

INTEGRATED VERTICAL TRANSISTORS AND LIGHT EMITTING DIODES

FIELD OF THE INVENTION

The present disclosure relates to semiconductor structures and, more particularly, to integrated vertical transistors and light emitting diodes and methods of manufacture.

BACKGROUND

A light-emitting diode (LED) is a p-n junction diode which emits light when activated. For example, when a suitable voltage is applied to the leads, electrons are able to recombine with electron holes within the device, releasing energy in the form of photons, with the color of the light (corresponding to the energy of the photon) determined by the energy band gap of the semiconductor. This effect is called electroluminescence. Light-emitting diodes are used in applications as diverse as aviation lighting, automotive headlamps, traffic signals, camera flashes, etc.

LEDs can be composed of different materials. A recent advancement, for example, is the use of gallium-nitride-on-silicon (GaN-on-Si) to produce LEDs. This combination avoids the typical costly sapphire substrate. Also, manufacturing large sapphire material is difficult, while large silicon material is cheaper and more abundant.

SUMMARY

In an aspect of the disclosure, a structure comprises a vertically oriented stack of material comprising a light emitting diode (LED) integrated with a source region and a drain region of a vertically oriented active device.

In an aspect of the disclosure, a structure comprises: a first doped region of an active device; a channel region of the active device, which is stacked on the first doped region; a second doped region of the active device, which is stacked on the channel region; a light emitting material of a light emitting diode, which is stacked on the second doped region; a dielectric material on a sidewall of the channel region; a gate material in contact with the dielectric material; and contacts to the first doped region, the second doped region, the gate material and the light emitting material, the contacts being provided at different depths for each of the first doped region, the second doped region, the gate material and the light emitting material.

In an aspect of the disclosure, a method comprises: stacking a plurality of materials in a vertical stack; doping portions of the stacked materials to form a first doped region and a second doped region, with an undoped channel region for an active device therebetween and a light emitting portion on top of the second doped region; forming a gate metal at a level of the channel region and separated by a dielectric material formed on a sidewall of the channel region; and forming contacts to the first doped region, the second doped region, the gate metal of the active device and the light emitting portion on top of the second doped region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
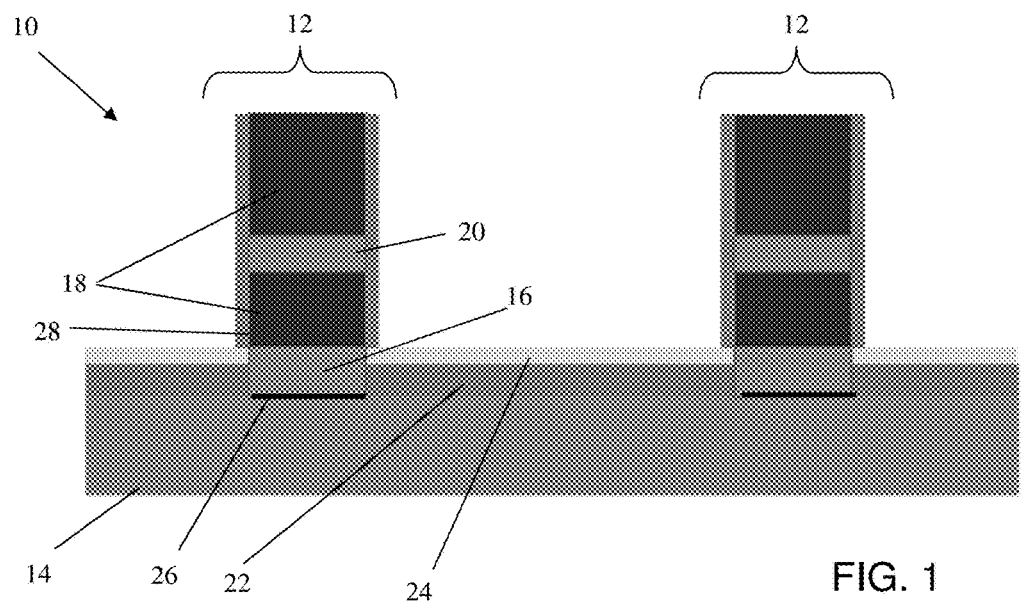
FIG. 1 shows a structure and respective fabrication processes in accordance with aspects of the present disclosure.

The present disclosure relates to semiconductor structures and, more particularly, to integrated vertical transistors and light emitting diodes (LEDs) and methods of manufacture. More specifically, the present disclosure relates to monolithic integration of GaN vertical transistors with GaN LEDs. Advantageously, by sharing the same GaN-based material platform the monolithic integration of LEDs and vertical transistors (e.g., high-electron-mobility transistors (HEMTs)) reduce the form factor and manufacturing cost of an LED lighting system while also greatly improving the system stability and reliability.

GaN-based high-power light-emitting diodes (LEDs) used in lighting applications typically require dedicated electronic driver circuits for AC-DC power conversion, current sourcing, and dimming using pulse-width modulation (PWM) or analog current control methods. GaN power switching field-effect transistors (FETs), such as metal-oxide-semiconductor (MOS) FETs, high-electron-mobility transistors (HEMTs), and MOS-Channel HEMTs (MOSCHEMTs) have shown outstanding performance in terms of high breakdown voltage (BV), low specific on-resistance, and high operating frequency, and can be very useful as output devices for emerging applications of high power-high voltage LED systems.

By providing a monolithic integration of GaN-based LEDs and GaN power transistors (e.g., HEMTs), significant reduction in cost and the size of solid state lighting systems has been achieved. In addition, such integration also improves system reliability and serves as a technology platform for the development of light-emitting power integrated circuits (LEPICs). LEPICs can also play an important role in adding functionalities required for emerging solid state lighting applications such as visible light communication (VLC) and other LED control technologies required for smart lighting applications. The monolithic integration of the GaN-based LEDs and GaN power transistors can be implemented in inorganic light emitting diode (ILED) displays for virtual and augmented reality displays, amongst other applications.

The integrated vertical transistors and LEDs of the present disclosure can be manufactured in a number of ways using a number of different tools. In general, though, the methodologies and tools are used to form structures with dimensions in the micrometer and nanometer scale. The methodologies, i.e., technologies, employed to manufacture the integrated vertical transistors and LEDs of the present disclosure have been adopted from integrated circuit (IC) technology. For example, the structures are built on wafers and are realized in films of material patterned by photolithographic processes on the top of a wafer. In particular, the fabrication of the integrated vertical transistors and LEDs uses three basic building blocks: (i) deposition of thin films of material on a substrate, (ii) applying a patterned mask on top of the films by photolithographic imaging, and (iii) etching the films selectively to the mask.

FIG. 1 shows a structure and respective fabrication processes in accordance with aspects of the present disclosure. In particular, the structure 10 of FIG. 1 includes nanowires, e.g., LEDs, 12 formed on a substrate 14. In embodiments, the substrate 14 may be composed of any suitable material including, but not limited to, Si, SiGe, SiGeC, SiC, GaAs, InAs, InP, and other III/V or II/VI compound semiconductors. The nanowires 12 can include bandgap semiconductor material 18 vertically interlaced (e.g., vertically layered) with first doped regions (e.g., source regions) 16 and second doped regions (e.g., drain regions) 20 formed of the same or different materials as described herein.

In embodiments, the source regions 16 and drain regions 20 can be used to form a GaN vertical transistor, e.g., Schottky diodes; whereas, the bandgap semiconductor material 18 between the source regions 16 and drain regions 20 can be used to drive the transistor (e.g., channel region of the transistor). That is, the driver can be the whole transistor configuration, e.g., composed of the drain, source and channel region.

The bandgap semiconductor material 18 can be, e.g., Gallium Nitride (GaN) used in light-emitting diodes. As should be understood by those of skill in the art, GaN has a wide band gap of 3.4 eV which affords it special properties for applications in optoelectronic, high-power and high-frequency devices. In alternate embodiments, the bandgap semiconductor material 18 between the source regions 16 and drain regions 20 can be a Si material (deposited using conventional deposition methods) to form an integrated vertical silicon transistor and the GaN LED diode, vertically. Also, in embodiments, the integration of the LED can also be with a HEMT GaN.

It should be understood by those of ordinary skill in the art that the cathode of the LED 12 and the drain of the transistor (e.g., MOSFET) are electrically connected. This essentially means that the electron flow (originated from the source terminal) injecting into the cathode of the LED (through the drain) is uniform and well controlled, and switched by biased gate voltage, as is the LED's light output power. Also, this is a serial connection between the transistor and LED making it a very compact design.

It is further contemplated herein the LED structure could comprise N+ GaN, undoped or unintentionally doped GaN, GaxIn1−xN (where x range from 0-1), quantum well structure, P+ AlGaN, and P+ GaN, etc., as represented by reference numeral 12. It is further contemplated herein that if using silicon for a substrate, the LED structure can comprise of a GaN nucleation layer, undoped GaN layer, Si-doped n-type (n=5×10$^{18}$ cm$^{−3}$) GaN, an unintentionally doped active region of InGaN/GaN multiple quantum wells (MQW) Mg-doped p-type (p=3×10$^{17}$ cm$^{−3}$) GaN layer, all of which are represented at reference numeral 12. On the other hand, it is also contemplated herein that if the LED is grown directly on GaN, then the nucleation and buffer region is not needed; whereas, for every growth of GaN on silicon, the nucleation and buffer region would preferably be required.

The bandgap semiconductor material 18 and source regions 16 and drain regions 20 can be formed by conventional deposition methods, e.g., epitaxial growth processes, followed by conventional patterning processes, e.g., lithography and etching (reactive ion etching (RIE)) processes. For example, in exemplary embodiments, the source regions 16 and drain regions 20 can be deposited by an epitaxial in-situ deposition process with a dopant, e.g., boron, phosphorous, arsenic, etc. In embodiments, for silicon applications, boron is used for PMOS devices; whereas, phosphorous or arsenic are used for NMOS devices. For LED applications, PMOS devices are not needed and mostly NMOS can be used. In embodiments, p- and n-type GaN, Mg and Si can be doped, e.g., For N—GaN: Si-doped n-type (n~5×10$^{18}$ cm$^3$)=1-8 E18 and for P—GaN: Mg-doped p-type (p~3×10$^{17}$ cm$^3$)=1-6 E17. The bandgap semiconductor material 18, on the other hand, can be deposited by an epitaxial in-situ deposition process without any dopants.

In embodiments, a buffer layer 26 can be provided between the source regions 16 and the substrate 14. The buffer layer 26 can be, e.g., AlNi or GaNi. In embodiments, the buffer layer 26 can be deposited by a conventional deposition method such as, e.g., chemical vapor deposition (CVD) processes, to a thickness of about 1 to 10 micrometers; although other dimensions are also contemplated herein.

Still referring to FIG. 1, a conductive layer 22 is deposited on the substrate 14, followed by a recess process. In embodiments, the conductive layer 22 is in direct electrical contact with the source region 16 and, as such, can be used for a source contact. For example, the conductive layer 22 can be deposited by a conventional sputtering process to cover the substrate 14 and LEDs 12, followed by an etching process, e.g., RIE, to recess the layer 22 to the source regions 16. The conductive layer 22 can be aluminum; although other materials are also contemplated herein. For example, the layer 22 can be a doped Si material. A spacer material 24 is then deposited on the conductive layer 22, followed by a recess process. In embodiments, the spacer material 24 can be SiN or SiO$_2$, as examples, having a final thickness (after the recessing process) of about 5 nm to about 15 nm; although other dimensions are also contemplated herein.

FIG. 1 further shows the deposition of a gate dielectric material 28. In embodiments, the gate dielectric material 28 can be a high-k dielectric material. For example, the high-k dielectric material can hafnium based dielectrics. In further embodiments, examples of such high-k dielectrics include, but are not limited: Al$_2$O$_3$, Ta$_2$O$_3$, TiO$_2$, La$_2$O$_3$, SrTiO$_3$, LaAlO$_3$, ZrO$_2$, Y$_2$O$_3$, Gd$_2$O$_3$, and combinations including multilayers thereof. The gate dielectric material 28 can undergo a directional selective etching process to remove material from horizontal surfaces, e.g., on the bandgap semiconductor material 18 and spacer material 24.

Figure 2:
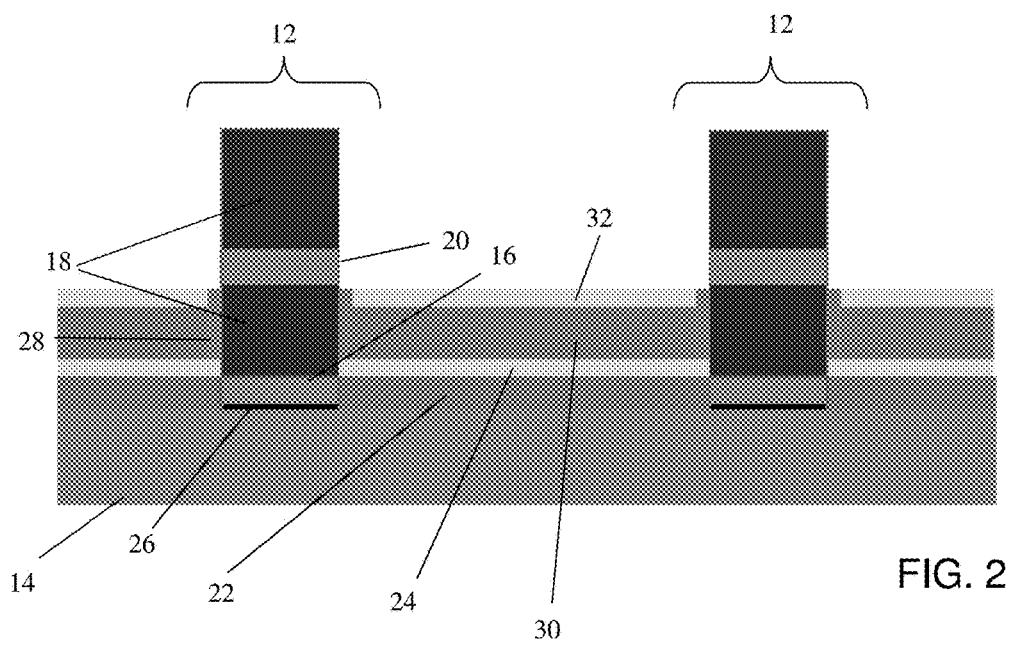
FIG. 2 shows layered materials on the structure of FIG. 1, amongst other features, and respective fabrication processes in accordance with aspects of the present disclosure.

In FIG. 2, a metal gate material 30 is deposited over a gate dielectric material 28 and spacer material 24. In embodiments, the metal gate material 30 can be deposited by a conventional sputtering process, followed by a recess etching process, e.g., RIE, to a level below the drain regions 20. The metal gate material 30 can be aluminum; although other materials are also contemplated herein as already noted herein. A spacer material 32 is then deposited on the metal gate material 30, followed by a recess process. In embodiments, the spacer material 32 can be SiN or SiO$_2$, as examples, with a final thickness of about 5 nm to about 15 nm. In embodiments, the recessing of the spacer material 32 should result in the spacer material 32 being below the drain regions 20.

Following the deposition of the spacer material 32, the gate dielectric material 28 is selectively recessed, e.g., removed, from the sides of the bandgap semiconductor material 18. In embodiments, the spacer material 32 will act as an etch stop layer, preventing further removal of the bandgap semiconductor material 18 to below the spacer material 32. In this way, the bandgap semiconductor material 18 will be slightly below the drain regions 20.

Figure 3:
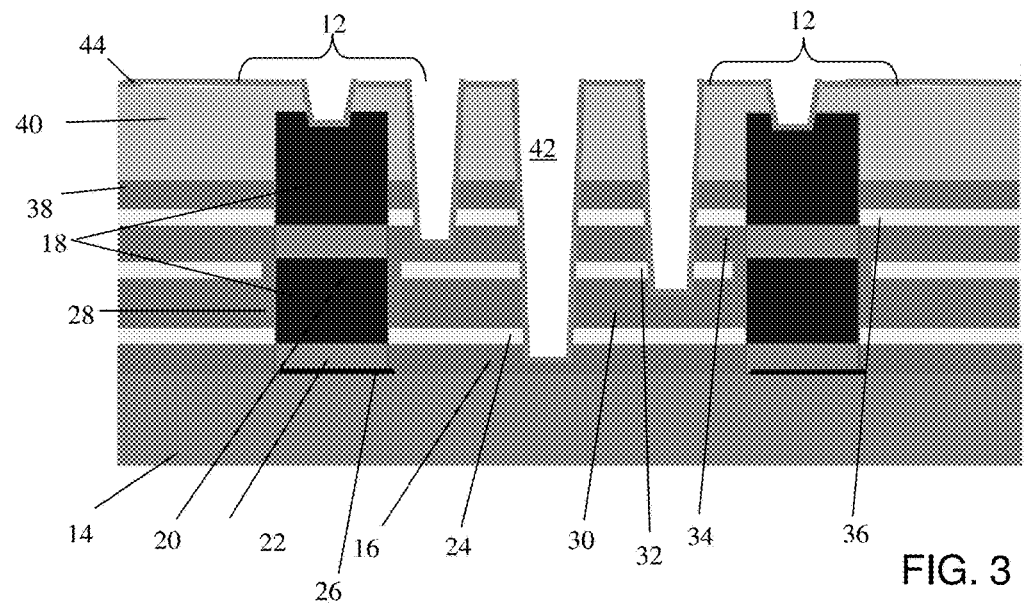
FIG. 3 shows trenches for contacts, amongst other features, and respective fabrication processes in accordance with aspects of the present disclosure.

Referring now to FIG. 3, a metal gate material 34 is deposited over the spacer material 32. In embodiments, the metal gate material 34 can be deposited by a conventional sputtering process, followed by a recess etching process, e.g., RIE, to a level of about the drain regions 20. The metal gate material 30 can be aluminum; although other materials are also contemplated herein as already noted herein. A spacer material 36 is then deposited on the metal gate material 30, followed by a recess process. In embodiments, the spacer material 36 can be SiN or $SiO_2$, as examples, with a final thickness of about 5 nm to about 15 nm. In embodiments, the recessing of the spacer material 36 should result in the spacer material 36 being above the drain regions 20.

Following the deposition of the spacer material 36, a bottom contact metal plate 38 is deposited over the spacer material 34. In embodiments, the bottom contact metal plate 38 can be deposited by a conventional sputtering process, followed by a recess etching process, e.g., RIE, to above the drain regions 20. The metal gate material 30 can be aluminum; although other materials are also contemplated herein as already noted herein. A spacer material 40, e.g., oxide, is then deposited on the bottom contact metal plate 38, followed by a polishing process, e.g., a chemical mechanical polishing (CMP). In embodiments, the top surface of the spacer material 38 should be above the material 20.

Still referring to FIG. 3, contact formation begins with an etching process to form a plurality of trenches 42. In embodiments, the trenches 42 will align with and expose the material 18, as well as the metal gate materials 16, 30, 34. In embodiments, the trenches 42 are formed in multiple lithography and etching (RIE) steps with selective chemistries to form the trenches 42 of different depths, e.g., source, drain and gate contact trenches, and contacts to the LEDs 12. The trenches 42 can be lined with liner material 44, e.g., TiN. The liner material 44 can be deposited by conventional deposition processes, e.g., atomic layer deposition (ALD) or plasma enhanced CVD (PECVD), to a thickness of about 10 nm to about 15 nm; although other dimensions are contemplated herein.

Figure 4:
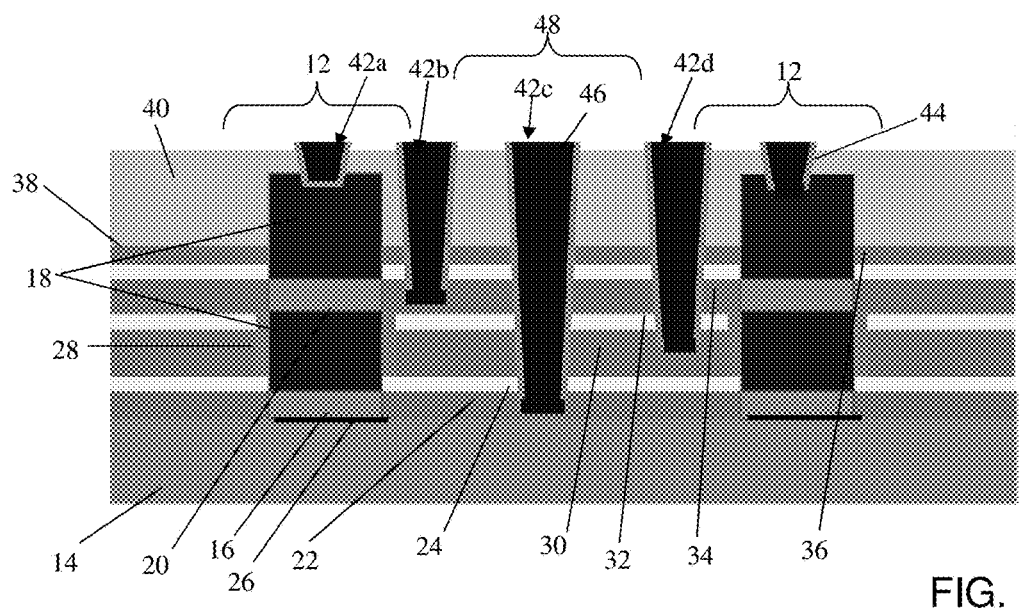
FIG. 4 shows contacts for a gate and LED, amongst other features, and respective fabrication processes in accordance with aspects of the present disclosure.

As shown in FIG. 4, the liner material 44 undergoes a directional spacer etch process, e.g., anisotropic etching process, to expose the material 18 of the LED devices, as well as the metal materials 22, 30, 34 at the bottom of the trenches 42. Following this etching process, a metal material 46 is deposited within the trenches 42 to form LED contacts 42a and drain contacts 42b (to the metal material 34), source contacts 42c (to the metal material 22) and gate contacts 42c (to the gate material 30) of the transistor 48. The metal material 46 can be tungsten, Al or Cu, as examples. In embodiments, the metal material 46 can be deposited by conventional CVD processes followed by removal of any excess material by a CMP process. In this representation, it should be understood by those of skill in the art that although the LED is grown on one transistor, e.g., Schottky diode 48, the transistor output (e.g., drain 20) can be connected to any LED 12; that is, one or more transistors can thus be connected to an LED.

FIGS. 5-9 show structures and respective fabrication processes in accordance with additional aspects of the present disclosure. In particular, FIGS. 5-9 are representative of a GaN LED formed on an Si vertical transistor. It should be understood, though, that the LED can be formed from other materials used for light emissions and that the transistor can be formed from other semiconductor material as already noted herein.

Figure 5:
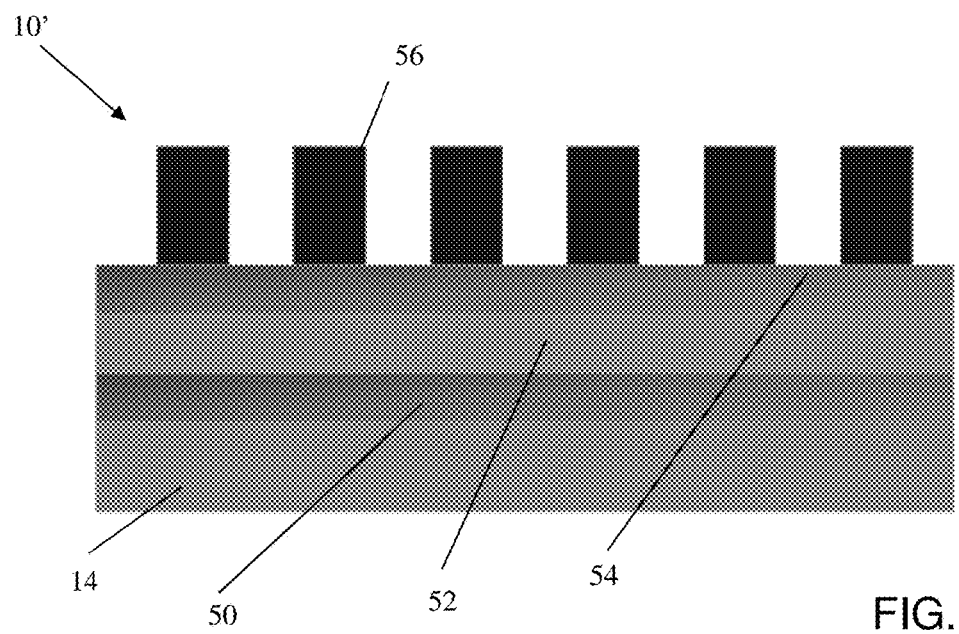
FIGS. 5-9 show structures and respective fabrication processes in accordance with additional aspects of the present disclosure.

More specifically, the structure 10' of FIG. 5 includes several layers 50, 52, 54 formed on a substrate 14. In embodiments, the substrate 14 may be composed of any suitable material including, but not limited to, Si, SiGe, SiGeC, SiC, GaAs, InAs, InP, and other III/V or II/VI compound semiconductors. The layers 50, 52, 54 can include, e.g., a doped source layer 52, an undoped channel region 54 and a doped drain region 56. In embodiments, the layers 50, 52, 54 can be any semiconductor material, e.g., Si, in which the doped source layer 52, and doped drain region 56 are deposited by an epitaxial growth process, with dopant implants driven into each of the layers to a desired depth using conventional ion implantation or diffusion processes, e.g., annealing with a dopant material; whereas, the undoped channel region 54 can be an epitaxial growth process without any dopants.

Figure 6:
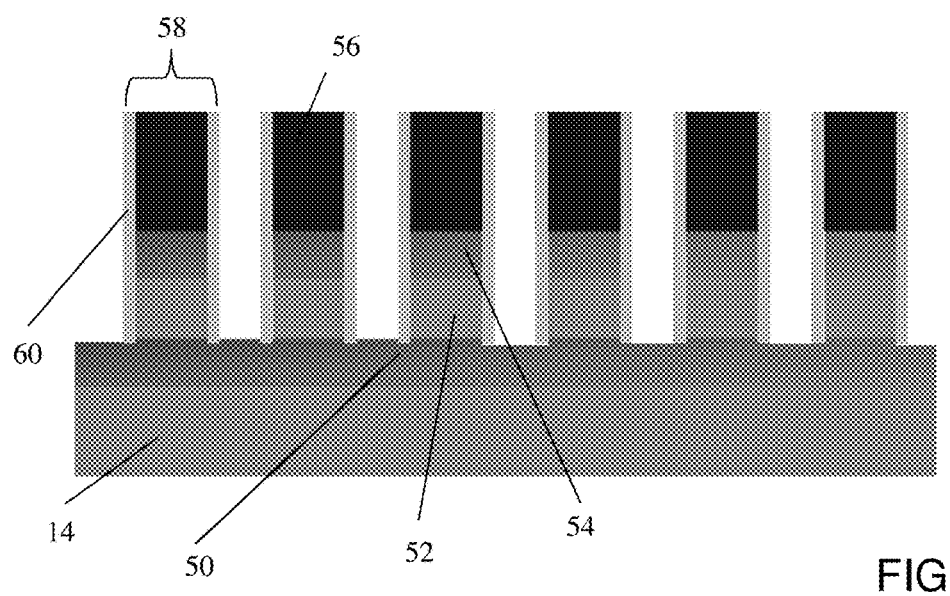

In FIG. 6, nanowires 58 are formed on the doped drain region 54. In embodiments, the nanowires 58 can be LEDs composed of bandgap semiconductor material 56, e.g., Gallium nitride (GaN) material, used in light-emitting diodes. By way of example to form the nanowires 58, the bandgap semiconductor material 56 can be deposited on the doped drain region 54 using a conventional deposition process, e.g., vapor-liquid-solid (VLS) growth process, followed by a patterning step, e.g., lithography and etching (RIE) processes. In embodiments, the etching process will pattern the bandgap semiconductor material 56, in addition to the doped drain region 54 and the undoped channel region 52 using selective etch chemistries. The etching will stop on the doped source layer 50 by using a timed etching technique, as an example. After the etching process, any masking material can be removed using conventional oxygen ashing or other stripant techniques.

FIG. 6 further shows the deposition of a gate dielectric material 60. In embodiments, the gate dielectric material 60 can be a high-k dielectric material. For example, the high-k dielectric material can hafnium based dielectrics. In further embodiments, examples of such high-k dielectrics include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate dielectric material 60 can undergo a directional selective etching process to remove material from horizontal surfaces, e.g., on the bandgap semiconductor material 18 and the doped source layer 50.

Figure 7:
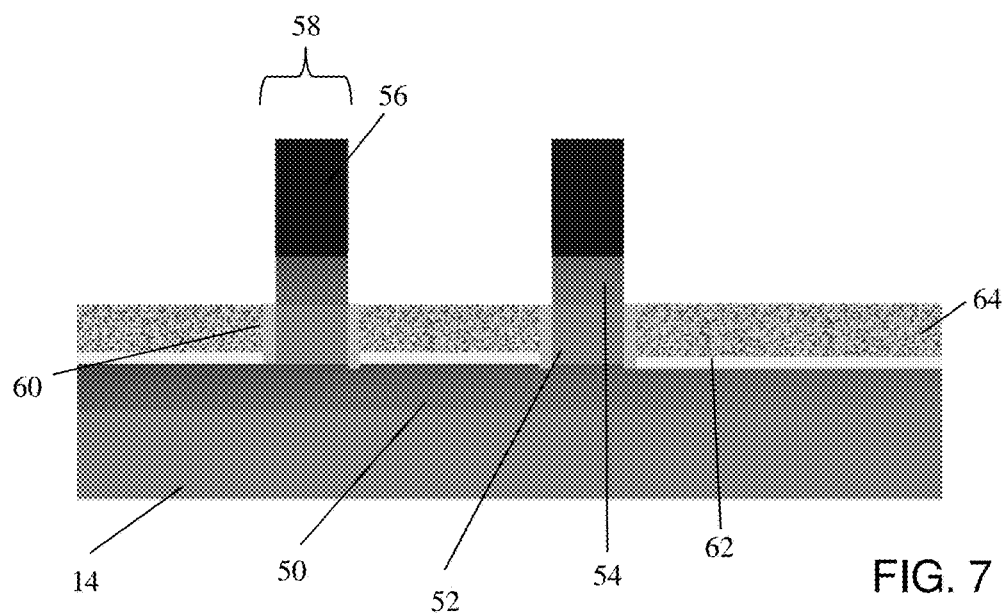

Referring now to FIG. 7, a spacer material 62 is deposited on the gate dielectric material 60, followed by a recess process. For example, the spacer material 62 can be a low-k dielectric material, e.g., oxide material, deposited using a CVD process. The spacer material 62 can then be recessed to a below an upper surface of the undoped channel region 52 using a RIE process. A poly gate material or metal gate material 64 is deposited on the spacer material 62, followed by a recess process. In embodiments, the poly gate material or metal gate material 64 can be recessed to a desired Lg gate height. Following the recessing of the poly gate material or metal gate material 64, the gate dielectric material 60 is selectively recessed, e.g., removed, from the sides of the nanowires 58, preferably to a surface of the undoped channel layer 52.

Figure 8:
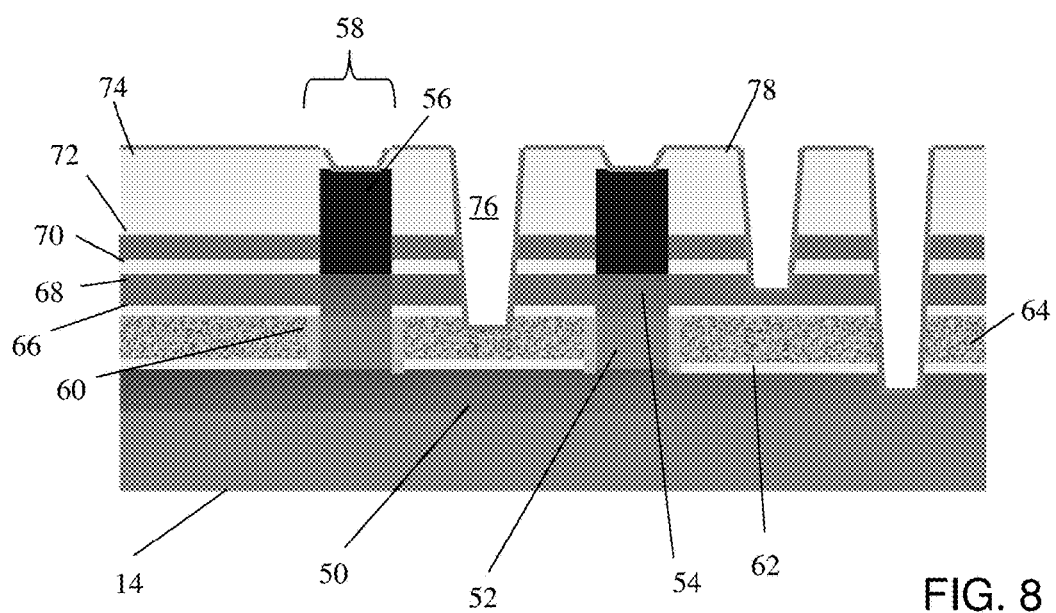

As shown in FIG. 8, multiple layers 66, 68, 70, 72 are deposited in sequential order on the structure shown in FIG. 1, followed by respective recessing processes as described herein. In embodiments, the multiple layers 66, 68, 70, 72 can be deposited using conventional deposition processes, e.g., CVD. The layers 66 and 74 are spacer material, e.g., oxide material; whereas, the layer 68 is a metal material used for a drain contact and the layer 72 is a metal material used for an LED contact. An oxide layer 74 is deposited on the layer 68, followed by a polishing step.

Still referring to FIG. 8, contact formation begins with an etching process to form a plurality of trenches 76. In embodiments, the trenches 76 will align with and expose the doped source region 50, the gate material 64, the drain contact layer 68 and the LED contact 72. Accordingly, in embodiments, the trenches 76 are formed in multiple lithography and etching (RIE) steps with selective chemistries to form the trenches 76 of different depths, e.g., source, drain and gate contact trenches, and contacts to the LEDs. The trenches 76 can be lined with liner material 78, e.g., TiN. The liner material 78 can be deposited by conventional deposition processes, e.g., atomic layer deposition (ALD) or plasma enhanced CVD (PECVD) to a thickness of about 10 nm to about 15 nm; although other dimensions are contemplated herein. The liner material 78 undergoes a directional spacer etch process, e.g., anisotropic etching process, to expose the doped source region 50, the gate material 64, the drain contact layer 68 and the LED contact 72 at the bottom of each trench 76.

Figure 9:
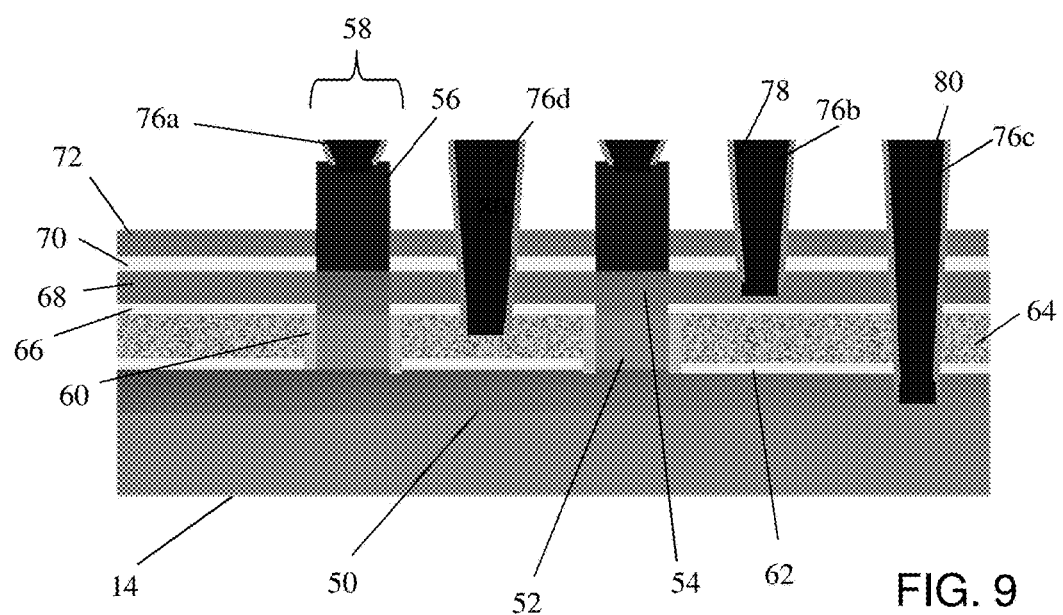

As shown in FIG. 9, a metal material 78 is deposited within the trenches 76 to form LED contacts 76a, drain contacts 76b, source contacts 76c and gate contacts 76d. The metal material 78 can be tungsten, Al or Cu, as examples. In embodiments, the metal material 78 can be deposited by conventional CVD processes followed by removal of any excess material by a CMP process. The oxide layer 74 can be recessed with a selective etch chemistry to allow for sidewall light emission from the LEDs. In this representation, the transistor output (e.g., drain) can be connected to any LED; that is, one or more transistors can thus be connected to an LED.

It should be understood that any metallization structure, e.g., contacts, can be formed by conventional lithography, etching and deposition methods known to those of skill in the art. For example, a resist formed over an upper material layer is exposed to energy (light) to form a pattern (opening). An etching process with a selective chemistry, e.g., reactive ion etching (RIE), will be used to form one or more trenches in the one or more underlying materials through the openings of the resist. The resist can then be removed by a conventional oxygen ashing process or other known stripants. Following the resist removal, the conductive material can be deposited by any conventional deposition processes, e.g., chemical vapor deposition (CVD) processes. Any residual material on the surface of the upper surface of the underlying material can be removed by conventional chemical mechanical polishing (CMP) processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a vertically oriented stack of material comprising a light emitting diode (LED) integrated with a source region, channel region and drain region of a vertically oriented active device.

2. The structure of claim 1, wherein the source region and the drain region are doped regions in the vertically oriented stack of material.

3. The structure of claim 2, wherein:
   the vertically oriented stack of material comprises a driver and a light emitting portion of the LED; and
   the driver and the light emitting portion of the LED are undoped material composed of a same material as the source region and the drain region.

4. The structure of claim 3, wherein the same material is GaN.

5. The structure of claim 2, wherein:
   the vertically oriented stack of material comprises a driver and light emitting portion of the LED;
   the driver and the light emitting portion of the LED are undoped material; and
   the light emitting portion of the LED is a different material than the driver, the source region and the drain region.

6. The structure of claim 5, wherein the light emitting portion of the LED is GaN and the driver, source region and the drain region are composed of Si.

7. The structure of claim 5, wherein the source region is shared amongst a plurality of stacks of the material.

8. The structure of claim 2, further comprising:
   the channel region of the active device located between the source region and the drain region;
   a dielectric material located on a sidewall of the channel region; and
   gate metal in direct contact with the dielectric material, the gate metal being on a side of the vertically oriented stack of material.

9. The structure of claim 8, further comprising contacts in electrical contact with the source region, the drain region, the gate metal and the light emitting portion of the LED.

10. The structure of claim 9, wherein the contacts are each formed at different levels of the vertically oriented stack of material.

11. The structure of claim 1, further comprising contacts in electrical contact with the source region, the drain region, a gate metal of the vertically oriented active device and the light emitting portion of the LED, wherein
   the vertically oriented stack of material comprises a driver and a light emitting portion of the LED, and
   a cathode of the LED and the drain region of the vertically oriented active device are electrically connected.

12. A structure, comprising:
   a first doped region of an active device;
   a channel region of the active device, which is stacked on the first doped region;

a second doped region of the active device, which is stacked on the channel region;
a light emitting material of a light emitting diode, which is stacked on the second doped region;
a dielectric material on a sidewall of the channel region;
a gate material in contact with the dielectric material; and
contacts to the first doped region, the second doped region, the gate material and the light emitting material, the contacts being different lengths for each of the first doped region, the second doped region, the gate material and the light emitting material.

13. The structure of claim 12, wherein the first doped region, the channel region, the second doped region and the light emitting material are composed of a same material.

14. The structure of claim 13, wherein the first doped region, the channel region, the second doped region and the light emitting material are composed of GaN and the source region and the drain region of the active device are P and N doped.

15. The structure of claim 12, wherein the first doped region, the channel region, and the second doped region are composed of a same material.

16. The structure of claim 15, wherein the first doped region, the channel region, and the second doped region are composed of Si material.

17. The structure of claim 16, wherein the light emitting material is composed of GaN.

18. The structure of claim 12, wherein the first doped region is a source region shared amongst several active devices.

19. The structure of claim 12, wherein the active device is a driver transistor.

20. The structure of claim 12, wherein the active device is one of a high electron mobility transistor (HEMT) and Schottky diode.

* * * * *